United States Patent
Kubo et al.

(10) Patent No.: US 6,767,400 B2
(45) Date of Patent: Jul. 27, 2004

(54) CRYSTAL GROWTH METHOD

(75) Inventors: Takayuki Kubo, Tokyo (JP); Fumio Kawahigashi, Tokyo (JP); Hiroshi Asano, Tokyo (JP); Shinichiro Miki, Tokyo (JP); Manabu Nishimoto, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 0 days.

(21) Appl. No.: 10/130,671

(22) PCT Filed: Sep. 25, 2001

(86) PCT No.: PCT/JP01/08313
§ 371 (c)(1),
(2), (4) Date: Sep. 24, 2002

(87) PCT Pub. No.: WO02/27079
PCT Pub. Date: Apr. 4, 2002

(65) Prior Publication Data
US 2003/0150373 A1 Aug. 14, 2003

(51) Int. Cl.[7] ............................................. C30B 15/20
(52) U.S. Cl. ........................ 117/15; 117/13; 117/217; 117/218; 117/222

(58) Field of Search ............................ 117/13, 15, 217, 117/218, 222, 14, 900

(56) References Cited

U.S. PATENT DOCUMENTS 6,036,776 A * 3/2000 Kotooka et al. ............. 117/217
6,071,341 A * 6/2000 Shimanuki et al. .......... 117/208
6,117,402 A * 9/2000 Kotooka et al. ........... 422/245.1

* cited by examiner

Primary Examiner—Felisa Hiteshew
(74) Attorney, Agent, or Firm—Morrison & Foerster LLP

(57) ABSTRACT

In the CZ process using a cooling member surrounding a single crystal, the cooling member is permitted to effectively serve to increase a pulling speed. Cracks of the single crystal due to excessive cooling are prevented to occur. A high crystal quality is acquired. In order to realize these objects, the temperature of the inner peripheral surface of the cooling member 6 opposing to the outer peripheral surface of the single crystal 4 is restricted to 500° C. or below, even in the lower end, the temperature of which becomes the highest. To achieve this restriction, the thickness T of the cooling member 5 is 10 to 50 mm. The height H of the cooling member 6 is 0.1 to 1.5 times the diameter D of the single crystal 4.

5 Claims, 1 Drawing Sheet

CRYSTAL GROWTH METHOD

TECHNICAL FIELD

The present invention relates to a crystal growing process used for manufacture of a silicon single crystal or the like utilized as a semiconductor material.

BACKGROUND ART

A variety of methods are available for manufacturing silicon single crystals, of which the Czochralski process (the CZ process) is typical. In producing a silicon single crystal by the CZ process, as is well known, a seed is immersed in a silicon melt formed in a quartz crucible. The seed is gradually pulled up to allow a silicon single crystal to grow beneath the seed while rotating the crucible and the seed.

In pulling up a silicon single crystal by means of the CZ process, it is known that the defect distribution etc. in the crystal cross section are governed by the rate of crystal growth, therefore the pulling speed. More specifically, as the pulling speed is increased, a ring-shaped OSF generation zone is moved towards the periphery and is finally excluded to the outside of the effective portion of the crystal. Conversely, a decrease in the pulling speed drifts a ring-shaped OSF generation zone towards the central part of the crystal, and eventually the zone disappears in the central part.

While both the outside and inside of an OSF generation zone are defect generation zones, their kinds of defects are different. In addition, it is known that a significant increase of the pulling speed, as a matter of course, improves productivity while refining the defects. Consequently, a speed-up in the pulling has been pursued as an approach to growing crystals.

Provision of a heat shield is known as a technique for high speed pulling. A heat shield is a cylindrical heat shielding member in a shape of inverted truncated cone that is disposed surrounding the single crystal. The shield is provided to speed up the pulling by shielding the radiation heat primarily from the melt in the crucible and heaters placed outside the crucible to facilitate cooling of the single crystal to be pulled up from the melt.

Furthermore, attention is recently given to a technique where a cylindrical cooling member that is forcibly cooled by water is placed inside the heat shield (Japanese Patent Laid-Open Nos. 63-256593, 8-239291, 11-92272 and 11-292684) Installation of a cylindrical cooling member that is forcibly cooled by water inside the heat shield surrounding the single crystal facilitates cooling of the single crystal, particularly the high temperature portion thereof, leading to a further speedup of the pulling.

However, it has turned out that the conventional crystal growing process using a cooling member does not always permit the cooling member to effectively increase the pulling speed and also causes the problems to be described below with regard to the quality of the single crystal and the safety of operation.

A copper-based metal member forcibly cooled by water passage is frequently used as a cooling member from the viewpoint of cooling capacity and cost efficiency for the single crystal. Providing simply such a cooling member does not serve to increase the pulling speed in many cases. When the cooling member does not effectively act for a speedup of the pulling, the diffusion of heavy metals such as Fe and Cu is facilitated leading to contamination of the single crystal starting from its periphery, because the portion of the single crystal with a high temperature of 1300° C. or above is elongated and the time in which the single crystal passes through an area of a high temperature of 1300° C. or above is increased as well.

Speed up of the pulling requires cooling of the portion of the single crystal with a high temperature of 1300° C. or above by a cooling member and its increased cooling capacity causes the risk of rapid cooling of the portion of 1300° C. or below also. The rapid cooling of the portion of 1300° C. or below also causes rapid deformation of the crystal caused by the cooling in dislocation of the crystal being pulled up. As a result, a residual stress is generated because of the difference of extent of the deformation in the boundary between the non-dislocated and dislocated portions, leading to the likely generation of cracks in cooling of the crystal drawing or after the pulling. When this crack is generated, the cooling member may be broken in some cases, leading to disasters including a steam explosion.

The object of the present invention to provide a crystal growing process that can make the cooling member effectively serve to increase pulling speed and also effectively prevent cracks caused by excessive cooling of the single crystal, in pulling the single crystal by the CZ process using a cooling member.

DISCLOSURE OF THE INVENTION

In order to achieve the above described object, the inventors focused attention on the dimensions of the cooling member and the surface temperature and have investigated in detail the relations between the high speed pulling and these factors. As a result, the following facts have been found.

When the thickness of the cooling member is less than 10 mm, the temperature of the cooling member is extremely increased because of the radiation from the single crystal, which in turn reduces the cooling efficiency for the crystal, leading to the difficulty in the realization of a high speed pulling. On the other hand, when the thickness exceeds 50 mm, not only the cooling efficiency stops increasing, but also the field of the view of a camera used for controlling the crystal diameter is restricted, and the flow of gases such as Ar that is flowed through the furnace is reduced leading to dislocation due to the precipitation of SiO.

When a portion with a temperature exceeding 500° C. exists in the inner peripheral surface of the cooling member opposing to the outer peripheral surface of the single crystal to be pulled from the melt, the cooling efficiency for the crystal is dramatically reduced, leading to the unrealization of a high speed pulling.

When the height of the cooling member is less than 0.1 times the diameter of the crystal, the portion of the single crystal with a high temperature of 1300° C. or above cannot be cooled efficiently. However, when its height exceeds 1.5 times the diameter of the crystal, the portion with a temperature of 1300° C. or below is rapidly cooled, and when a dislocation is formed in the single crystal, cracks are likely to be generated.

When the distance from the lowest end of the cooling member to the melt exceeds 100 mm, the effect of cooling of the portion of the single crystal with a high temperature of 1300° C. or above is significantly reduced, thereby making a speedup in the pulling difficult. On the other hand, when the distance is shorter than 10 mm, the risk of contact of the cooling member with the melt is increased. Further, the temperature of the melt close to the cooling member quickly decreases, causing the problem of the pulled crystal being likely to deform due to a decrease in the radial temperature gradient of the melt.

When the emissivity of the inner peripheral surface of the cooling member is less than 0.7, the effect of cooling of the portion of the single crystal with a high temperature of 1300° C. or above is reduced, leading to a difficulty in speedup of the pulling.

When the flow rate of the cooling water supplied to the cooling member is less than 1.5 L/min, the temperature of the cooling member is increased, and therefore the crystal cannot be cooled effectively. When the flow rate exceeds 30 L/min, the effect of cooling of the crystal stops increasing, resulting in a waste of the cooling water.

The crystal growing process of the present invention is made in view of the above described findings and permits the cooling member to effectively serve to increase the pulling speed, while effectively preventing cracks caused by excessive cooling of the single crystal, by utilizing a cooling member with a height 1.5 times or less the diameter of the above described single crystal and also by keeping 500° C. or below the temperature of the inner peripheral surface of the cooling member opposing to the outer peripheral surface of the single crystal, when crystal growing is carried out by utilizing a furnace equipped with a ring-shaped cooling member disposed surrounding the single crystal grown from a raw material melt by the CZ process.

The lower limit of the height of the cooling member is preferably 0.1 times or more the diameter of the single crystal, from the viewpoint of a speed-up in the pulling. The particularly preferable height is 0.25 to 1.0 times the diameter of the single crystal.

The temperature of the inner peripheral surface of the cooling member is not specified in particular, because the lower it is, the better. The particularly preferable surface temperature is 200° C. or below.

For other factors than the height of the cooling member and the temperature of the inner peripheral surface, the thickness of the cooling member is preferably from 10 to 50 mm. Additionally, the flow rate of the cooling water to be supplied to the cooling member is preferably from 1.5 to 30 L/min. In addition, the distance from the lower end of the cooling member to the melt surface is preferably from 10 to 100 mm. Furthermore, the emissivity of the inner peripheral surface of the cooling member is preferably not less than 0.7.

The cooling member is made of a metal material which is forcibly cooled by water passage. The primary component of the metal is preferably copper, which exhibits good heat conduction and is inexpensive. When the cooling member is composed of a copper-based metal, blacking by plating with black Cr metal or oxidation is effective as a method of increasing the emissivity of the inner peripheral surface. In particular, plating with black Cr metal also has the effect of protecting soft copper-based metal to suppress contamination by the crystal of copper.

In general, the pressure of the atmosphere inside the furnace is not more than 13300 Pa, and so heat transfer by the gas can be neglected and the heat removal from the pulled crystal is exclusively by heat radiation. In the crystal growing process of the present invention the height of the cooling member and the surface temperature are specified from this viewpoint, and the distance from the crystal surface to the cooling member is not particularly specified because heat transfer by the gas can be neglected.

It is advisable that the cooling member be combined with a heat shield and placed inside of it. Combination with a heat shield not only facilitates the cooling of the crystal, but also effectively constrains a rise in the temperature of the cooling member itself, thereby increasing the pulling speed.

BEST MODE FOR CARRYING OUT THE INVENTION

Figure 1:
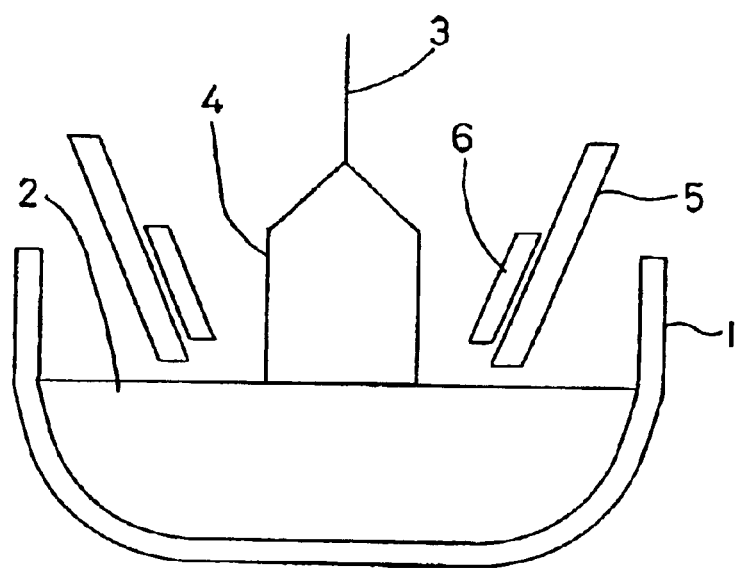
FIG. 1 shows a schematic block diagram of the inside of a furnace suitable for carrying out the crystal growing process of the present invention.

Referring to FIG. 1, an embodiment of the present invention will be described below.

The furnace is equipped with a main chamber and a pull chamber as the puller body. A crucible 1 is placed in the center of the main chamber. The crucible 1 is composed of an inner quartz crucible wherein polycrystalline silicon is loaded, and an outer supporting crucible made of graphite. This crucible 1 is driven rotated and elevated on a supporting axis called a pedestal.

Outside the crucible 1 is concentrically placed a resistance heater and in the farther outside of the heater is placed a thermal insulating tube along the inner surface of the main chamber. The heater melts polycrystalline silicon charged filled in the crucible 1 and forms a melt 2 of silicon in the crucible 1.

On the other hand, above the crucible 1 is hung a wire 3 as a pulling axis through the center of the pull chamber. The wire 3 is driven to be rotated or elevated in the axial direction by a pulling mechanism provided in the upper part of the pull chamber. In the lower end of the wire 3 is fixed a seed chuck holding a seed. A seed held by the seed chuck is immersed in the melt 2 in the crucible 1 and a silicon single crystal 4 is grown beneath the seed by driving the wire 3 to slowly lift the seed while rotating it.

Above the crucible 1 is also concentrically placed a cylindrical heat shield 5 surrounding the single crystal 4, close to the melt 2 of the crucible 1. The heat shield 5 is made of graphite and its diameter gradually increases from the lower part upwards in order to effectively shield the radiation heat from the melt 2 in the crucible 1, with the lower part of the shield inserted into the crucible 1 and the shield located above the melt 2 in the crucible 1.

Inside the heat shield 5 is concentrically installed a cylindrical cooling member 6. The cooling member 6 is composed of a copper-based metal of good heat conduction and is cooled forcibly by cooling water flowing through the inside of the object. This cooling member 6 is placed inside the lower part of the heat shield 6 and facilitates the cooling of its high temperature portion by surrounding the single crystal 4, particularly the high temperature portion immediately after the solidification. In addition, the cooling member 6, as the heat shield 5, is also of tapered shape wherein its diameter gradually increases from the lower part upwards.

Here, the height H of the cooling member 6 is selected to be in the range of 0.1 to 1.5 times the diameter D of the single crystal 4 and in this case the height is selected to be the same as D. The thickness T of the cooling member 6 is selected in range of the 10 to 50 mm and in this case 40 mm is selected. The distance L from the lower end of the cooling member 6 to the melt 2 is selected in the range of 10 to 100 mm and in this case 30 mm is selected.

In addition, the inner peripheral surface of the cooling member 6 is treated by oxidation so that the emissivity of the surface is not less than 0.7, and in this case the emissivity is 0.9. The temperature of the inner peripheral surface is adjusted so that even the lower end portion, which has the highest temperature, does not exceed 500° C., and in this case a temperature of 30° C. has been realized as the temperature of the lower end portion by adjusting to the range of 1.5 to 30 L/min the flow rate of the cooling water that is supplied by the cooling member 6.

Now, operational examples will be described of crystal growth by the above described furnace.

A raw material of 100 kg of polycrystalline silicon is charged in the crucible 1 and then the inside of the chamber is made to be an Ar atmosphere of 1330 Pa. The raw material of polycrystalline silicon in the crucible 1 is melted via the heater placed in the outside of the crucible 1, and using a seed of 100 orientation a single crystal with a diameter of 200 mm is made to grow beneath the seed.

In this operation, the crucible 1 is gradually lifted, taking into account the crystal growth, in such a way that the surface level of the melt 2 in the crucible 1 is kept constant. In addition, the crucible 1 is rotated in the direction opposite to or in the same direction as the rotational direction of the single crystal 4.

Since the height H of the cooling member 6, which is in the range of 0.1 to 1.5 times the diameter D of the single crystal 4, was selected to be the same as D (200 mm), and the temperature of the inner peripheral surface of the cooling member 6 in its lower end portion, wherein the temperature becomes the highest, was adjusted to 30° C., a speed of 2.5 mm/min was attained as the average pulling speed at the cylindrical part of the single crystal.

Pulling of this single crystal was conducted 5 times and no cracks were produced. The number of LPDs of the wafer with 0.09 μm or more sampled from the single crystal was not more than 300/wf and the number of LPDs with 0.13 μm or more was not more than 10/wf. The Fe concentration was not more than $1 \times 10^{10}/cm^3$.

Similar pulling was carried out with various values of the thickness T and the height H of the cooling member 6. The pulling conditions are given in Table 1 and the results in Table 2. The operational example 1 shows the results of the above described operation and the average pulling speed is 2.5 mm/min.

TABLE 1

|  | Average thickness of cooling member | Height of cooling member | Distance from the lower end of cooling member to the melt surface | Lower end temperature of cooling member |
|---|---|---|---|---|
| #1 (Example of the present invention) | 40 mm | 200 mm | 30 mm | 30° C. |
| #2 (Example of the present invention) | 10 mm | 200 mm | 30 mm | 400° C. |
| #3 (Comparative Example) | 5 mm | 200 mm | 30 mm | 550° C. |
| #4 (Comparative Example) | 40 mm | 400 mm | 30 mm | 30° C. |

TABLE 2

|  | Average speed | LPD of not less than 0.09 μm | LPD of not less than 0.13 μm | Fe concentration | Generation rate of crack |
|---|---|---|---|---|---|
| #1 (Example of the present invention) | 2.5 mm/min | 300/wf or less | 10/wf or less | $1 \times 10^{10}/cm^3$ or less | 0 in 5 |
| #2 (Example of the present invention) | 2 mm/min | 400/wf or less | 12/wf or less | $1 \times 10^{10}/cm^3$ or less | 0 in 5 |
| #3 (Comparative Example) | 1.3 mm/min | 1500/wf or less | 50/wf or less | $5 \times 10^{11}/cm^3$ or less | 0 in 5 |
| #4 (Comparative Example) | 2.5 mm/min | 300/wf or less | 12/wf or less | $1.2 \times 10^{10}/cm^3$ or less | 4 in 5 |

As in the operational example 1, in an operational example 2, the thickness of the cooling member 6 was reduced from 40 mm to 10 mm. As a result, the inner peripheral surface temperature of the lower end of the cooling member 6 was increased from 30° C. to 400° C. Although the average pulling speed was reduced to 2 mm/min, it is still a high level. Both the number of LPDs and the Fe concentration were still in a low level and no crack was generated.

For an operational example 3, the thickness of the cooling member 6 was reduced to 5 mm. As a consequence, the inner peripheral surface temperature of the lower end of the cooling member 6 exceeded 500° C. and rose to 550° C. The average pulling speed was decreased to 1.3 mm/min. No crack was produced, while the number of LPDs and the Fe concentration were remarkably increased.

In an operational example 4, the height of the cooling member 6 was increased from 200 mm to 400 mm, which exceeds 1.5 times the diameter D of the single crystal 4. The thickness of the cooling member 6 was kept 40 mm; the inner peripheral surface temperature of the lower end of the cooling member 6 was 30° C. An average pulling speed of 2.5 mm/min was acquired and both the number of LPDs and the Fe concentration were relatively low, and cracks were generated in four out of five single crystals.

As is seen from these results, for the purpose of permitting the cooling member 6 to effectively function for a speed up in the pulling, the control of the inner peripheral surface temperature of the cooling member 6 is primarily important, and secondly the thickness, which greatly affects the inner peripheral surface temperature, is an important factor. These are also important from the viewpoint of ensuring the crystal quality. In addition, for the prevention of cracks caused by excessive cooling of the single crystal 4, the height of the cooling member 6 is especially an important factor.

In this regard, when a cooling member is not used, the average pulling speed is 1.0 mm/min, the number of LPDs of not less than 0.09 µm is not more than 2000/wf, the number of LPDs of not less than 0.13 µm is not more than 100/wf, and the Fe concentration is not more than $1\times10^{12}/$cm$^3$.

In addition to these operational examples, in the operational example 1, the crystal was pulled up after addition of nitrogen or carbon to the melt; as a result, the number of LPDs of not less than 0.09 µm was greatly reduced. Consequently, it has been turned out that the addition of nitrogen or carbon to the melt in the crystal growing process of the present invention accelerates fining of LPD to proceed.

In addition, in the operational example 1, when the pulling speed was reduced in half to 1.25 mm/min and the pulling was conducted under the condition of the ring-shaped OSF generation zone almost vanishing in the center of the crystal, the number of LPDs of not less than 0.09 µm was greatly reduced to 100/wafer. Consequently, it has been found out that the speedup is possible for crystals that are conventionally pulled up at a speed of 1 mm/min or lower, used for the low LPD wafer charging monitor, and that the present invention is effective in a low-speed pulling for the low LPD wafer charging monitor as well.

INDUSTRIAL APPLICABILITY

As has been explained thus far, in the rotational pulling using of a cooling member, the crystal growing process of the present invention permits the cooling member to effectively serve to increase a pulling speed and also can effectively prevent the cracks due to the excessive cooling of the single crystal, by controlling the inner peripheral surface temperature and the height of the cooling member. Furthermore, a high quality of the crystal can be ensured as well. Hence, the process is suitable for economical manufacture of a single crystal with high quality.

What is claimed is:

1. A crystal growing process wherein, when caring out crystal growth using a furnance equipped with a ring-shaped cooling member placed so as to surround a single crystal grown from a raw material melt by means of the Czochralski process, a cooling member with a height being not more than 1.5 times the diameter of said single crystal is used, and the temperature of the inner peripheral surface of said single crystal is not more than 500° C.

2. The crystal growing process according to claim 1, wherein the thickness of said cooling member is from 10 to 50 mm.

3. The crystal growing process according to claim 1, wherein the flow rate of the cooling water to be supplied to said cooling member is from 1.5 to 30 L/min.

4. The crystal growing process according to claim 1, wherein the distance from the lower end of said cooling member to the melt surface is from 10 to 100 mm.

5. The crystal growing process according to claim 1, wherein the emissivity of the inner peripheral surface of said cooling member is not less than 0.7.

* * * * *